(12) United States Patent
Wilson et al.

(10) Patent No.: US 12,101,097 B2
(45) Date of Patent: Sep. 24, 2024

(54) COULOMB COUNTER CIRCUITRY

(71) Applicant: Cirrus Logic International Semiconductor Ltd., Edinburgh (GB)

(72) Inventors: Paul Wilson, Linlithgow (GB); James T. Deas, Edinburgh (GB); Mucahit Kozak, Austin, TX (US); Graeme G. Mackay, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 158 days.

(21) Appl. No.: 17/987,448

(22) Filed: Nov. 15, 2022

(65) Prior Publication Data

US 2023/0179217 A1    Jun. 8, 2023

Related U.S. Application Data

(60) Provisional application No. 63/286,239, filed on Dec. 6, 2021.

(51) Int. Cl.
*H03M 1/10* (2006.01)
*H03M 1/06* (2006.01)

(52) U.S. Cl.
CPC ....... *H03M 1/1023* (2013.01); *H03M 1/0609* (2013.01)

(58) Field of Classification Search
CPC ........ H03M 1/06; H03M 1/10; H03M 1/1023; H03M 1/0609
See application file for complete search history.

(56) References Cited

U.S. PATENT DOCUMENTS

| 7,362,255 B1* | 4/2008 | Tsyrganovich | ......... | H03M 3/34 341/172 |
| 7,551,110 B1* | 6/2009 | Tsyrganovich | ......... | H03M 3/34 329/307 |

(Continued)

FOREIGN PATENT DOCUMENTS

TW    201323905 A    6/2013

OTHER PUBLICATIONS

Combined Search and Examination Report under Sections 17 and 18(3), UKIPO, Application No. GB2402907.6, mailed Apr. 26, 2024.

(Continued)

*Primary Examiner* — Lam T Mai
(74) *Attorney, Agent, or Firm* — Jackson Walker L.L.P.

(57) ABSTRACT

Coulomb counter circuitry operable in a first mode of operation and a second mode of operation, the coulomb counter circuitry comprising: first analog to digital converter (ADC) circuitry configured to generate a first ADC output signal indicative of a current through a load coupled to the coulomb counter circuitry; second analog to digital converter (ADC) circuitry; offset correction circuitry; and accumulator circuitry configured to generate a signal indicative of a cumulative amount of charge transferred to the load, wherein in the second mode of operation, the coulomb counter circuitry is operable to enable the second ADC circuitry and to generate an offset correction factor based at least in part on a second ADC output signal output by the second ADC circuitry, and wherein in subsequent operation of the coulomb counter circuitry in the first mode of operation, the offset correction circuitry applies the offset correction factor to the first ADC output signal.

21 Claims, 9 Drawing Sheets

(56) References Cited

U.S. PATENT DOCUMENTS

| | | | | |
|---|---|---|---|---|
| 8,436,760 | B1* | 5/2013 | Hatanaka | H03M 1/34 |
| | | | | 341/122 |
| 9,685,967 | B1* | 6/2017 | Motz | H03M 3/34 |
| 9,712,774 | B1* | 7/2017 | Sun | H04N 25/75 |
| 10,236,900 | B1* | 3/2019 | Loveless | H03K 5/24 |
| 10,666,283 | B2* | 5/2020 | Linkewitsch | H03M 1/1245 |
| 11,057,047 | B2* | 7/2021 | Quiquempoix | H03M 1/462 |
| 11,133,813 | B2* | 9/2021 | Lai | H03M 1/804 |
| 11,489,536 | B1* | 11/2022 | Clara | H04B 1/48 |
| 11,735,942 | B2* | 8/2023 | Mackay | H01M 10/0525 |
| | | | | 320/127 |
| 11,777,516 | B2* | 10/2023 | Melanson | H03M 3/344 |
| | | | | 341/143 |
| 2009/0058697 | A1* | 3/2009 | Aas | G01R 19/0092 |
| | | | | 341/118 |
| 2016/0344403 | A1 | 11/2016 | Sonnaillon | |
| 2017/0085349 | A1* | 3/2017 | Ho | H04B 1/123 |
| 2017/0288439 | A1* | 10/2017 | Tamegai | H03M 3/468 |
| 2018/0136899 | A1* | 5/2018 | Risberg | G06F 3/165 |
| 2020/0373938 | A1* | 11/2020 | Quiquempoix | H03M 3/382 |
| 2021/0172808 | A1* | 6/2021 | Poirier | G01K 7/01 |
| 2021/0328594 | A1* | 10/2021 | Balar | H03M 1/1071 |
| 2022/0038111 | A1* | 2/2022 | Morgan | H02P 7/29 |
| 2022/0263519 | A1* | 8/2022 | Melanson | H03M 3/414 |
| 2022/0263520 | A1* | 8/2022 | Thomsen | H03M 3/356 |
| 2022/0385252 | A1* | 12/2022 | Soell | H03M 3/458 |
| 2023/0184842 | A1* | 6/2023 | Lin | H01M 10/00 |
| | | | | 702/63 |

OTHER PUBLICATIONS

Combined Search and Examination Report under Sections 17 and 18(3), UKIPO, Application No. GB2218230.7, mailed May 25, 2023.

* cited by examiner

COULOMB COUNTER CIRCUITRY

FIELD OF THE INVENTION

The present disclosure relates to coulomb counter circuitry, and in particular to calibration of coulomb counter circuitry.

BACKGROUND

Many modern-day electronic devices include one or more batteries or battery packs. Rechargeable batteries are becoming ubiquitous in a wide range of applications and devices such as, for example, electric vehicles (EVs), electric bicycles, scooters, wheelchairs, power tools, portable electronic devices such as mobile telephones tablet and laptop computers, consumer electronics, and energy storage systems. The ability to accurately estimate a battery's state of charge (SOC) is important for battery management that is intended to be safe, efficient, and reliable.

A coulomb counter is a kind of signal processing circuitry that is known in the art. A coulomb counter operates essentially by integrating the current drawn from a battery over time to provide an output signal indicative of a change in a state of charge (SOC) of a battery over time (e.g. between an initial measurement point such as when the battery has been recharged to its full capacity, at which point the battery and the coulomb counter are synchronised, and a subsequent measurement point). Thus, one example application of the coulomb counter is for battery management, where the coulomb counter measures and reports the state of charge (SOC) and/or battery capacity etc. of one or more battery cells and/or battery packs.

Signal processing circuitry such as coulomb counters is typically manufactured using conventional CMOS processing on a monolithic integrated circuit (IC) and such an IC is typically tested and calibrated post-manufacture in a production test process, to determine electrical and mechanical parameters under different operational and/or environmental conditions.

FIG. 1 is a schematic representation of example coulomb counter circuitry. The coulomb counter circuitry, shown generally at 100 in FIG. 1, comprises a current sense resistor 110, which in this example is coupled in series with a battery 102 that provides a positive supply voltage V+. A load 120 is coupled between the current sense resistor 110 and a current return path to a negative terminal of the battery 102.

In the illustrated example only a single load 120 is shown, but it will be appreciated by those of ordinary skill in the art that in some applications two or more loads (which may be coupled in parallel with each other) may be powered by the battery 102.

A first node 112 coupled to a first terminal of the current sense resistor 110 is coupled to first input of subtractor circuitry 114 and a second node 116 coupled to a second terminal of the current sense resistor 110 is coupled to a second input of the subtractor circuitry 114. The subtractor circuitry 114 is configured to subtract a voltage at the second node 116 from a voltage at the first node 112 and output a difference voltage (which is equal to a voltage across the current sense resistor 110) to an input of analog to digital converter (ADC) circuitry 130. An output of the ADC circuitry 130 is coupled to an input of charge accumulator circuitry 140.

In this example the ADC circuitry 130 has a single-ended input, but it will be appreciated by those of ordinary skill in the art that differential ADC circuitry could equally be used.

In such an arrangement, the first node 112 is coupled to a first input of the differential ADC circuitry and the second node 116 is coupled to a second input of the differential ADC circuitry, such that a differential voltage between the inputs of the differential ADC circuitry is equal to the voltage across the current sense resistor 110.

The voltage across the current sense resistor 110 is indicative of the current through the current sense resistor 110, and thus of the current through the load 120. The ADC circuitry 130 is operative to receive this analog voltage at its input and to convert it into a digital ADC output signal representing the current through the load.

The charge accumulator circuitry 140 is operative to receive the digital ADC output signal and to integrate it over time to generate a digital charge accumulator output signal Qout, representing the cumulative amount of charge transferred from the positive supply rail V+ to the load 120.

The ADC circuitry 130 and the charge accumulator circuitry 140 are sampled at a frequency $f_c$ Hz (e.g. in synchronisation with a clock signal at the frequency $f_c$ generated by a clock generator, not shown in FIG. 1), such that the digital ADC output signal and the digital charge accumulator output signal Qout are updated once every $1/f_c$ seconds. The digital charge accumulator output signal Qout may thus be used (e.g. by downstream processing circuitry, not shown in FIG. 1) to provide an indication of a state of charge (SOC) of a battery that supplies the positive supply rail V+.

SUMMARY

According to a first aspect, the invention provides coulomb counter circuitry operable in a first mode of operation and a second mode of operation, the coulomb counter circuitry comprising:
  first analog to digital converter (ADC) circuitry configured to generate a first ADC output signal indicative of a current through a load coupled to the coulomb counter circuitry;
  second analog to digital converter (ADC) circuitry;
  offset correction circuitry; and
  accumulator circuitry configured to generate a signal indicative of a cumulative amount of charge transferred to the load,
  wherein in the second mode of operation, the coulomb counter circuitry is operable to enable the second ADC circuitry and to generate an offset correction factor based at least in part on a second ADC output signal output by the second ADC circuitry,
  and wherein in subsequent operation of the coulomb counter circuitry in the first mode of operation, the offset correction circuitry applies the offset correction factor to the first ADC output signal.

The second ADC circuitry may be configured to have a higher resolution than the first ADC circuitry.

The first ADC circuitry may comprise delta-sigma ADC circuitry, for example.

The second ADC circuitry may comprise successive approximation register (SAR) ADC circuitry, for example.

The coulomb counter circuitry may be configured to disable the second ADC circuitry in the first mode of operation.

The coulomb counter circuitry may further comprise:
  first sample and hold circuitry configured to sample an output signal of the accumulator circuitry at a first sample time to generate a first sample;

second sample and hold circuitry configured to sample an output signal of the accumulator circuitry at a second sample time to generate a second sample;

subtractor circuitry configured to generate a difference signal indicative of a difference between the first sample and the second sample; and first multiplier circuitry configured to apply a predetermined first scaling factor to the difference signal to generate the offset correction factor.

The coulomb counter circuitry may further comprise:

second multiplier circuitry configured to apply a predetermined second scaling factor to the second ADC output signal to generate a scaled second ADC output signal of higher resolution than the first ADC output signal; and adder circuitry configured to add the scaled second ADC output signal to the first ADC output signal to generate a combined adder output signal of higher resolution than the first ADC output signal, wherein the coulomb counter circuitry is configured to supply the combined adder output signal to the accumulator circuitry in the second mode of operation.

The predetermined second scaling factor may be based at least in part on a gain of the first ADC circuitry and a gain of the second ADC circuitry.

The first ADC circuitry may comprise delta-sigma ADC circuitry, and the predetermined second scaling factor may be based at least in part on a gain of the first ADC circuitry, a gain of the second ADC circuitry and a gain of a feedback DAC circuitry of the delta-sigma ADC circuitry.

The first ADC circuitry may comprise sigma-delta ADC circuitry, and the coulomb counter circuitry may further comprise: pulse generator circuitry; differentiator circuitry; and processing circuitry.

In the second mode of operation: the pulse generator circuitry may be operable to supply a single pulse of a predetermined magnitude to an input of feedback DAC circuitry of the sigma-delta ADC; the differentiator circuitry may be operable to receive a digital output signal generated by the second ADC circuitry based on the single pulse and to output a differentiated output signal to the processing circuitry; and the processing circuitry may be operable to generate the predetermined second scaling factor based on the magnitude of the single pulse and the differentiated output signal.

The coulomb counter circuitry may further comprise:

second multiplier circuitry configured to apply a predetermined second scaling factor to the second ADC output signal to generate a scaled second ADC output signal of higher resolution than the first ADC output signal, and the coulomb counter circuitry may be configured to supply the scaled second ADC output signal to the accumulator circuitry in the second mode of operation.

The predetermined second scaling factor may be based at least in part on a gain of the first ADC circuitry and a gain of the second ADC circuitry.

The first ADC circuitry may comprise delta-sigma ADC circuitry, and the predetermined second scaling factor may be based at least in part on a gain of the first ADC circuitry, a gain of the second ADC circuitry and a gain of a feedback DAC circuitry of the delta-sigma ADC circuitry.

The first ADC circuitry may comprise sigma-delta ADC circuitry, and the coulomb counter circuitry may further comprise: pulse generator circuitry; differentiator circuitry; and processing circuitry.

In the second mode of operation: the pulse generator circuitry may be operable to supply a single pulse of a predetermined magnitude to an input of feedback DAC circuitry of the sigma-delta ADC; the differentiator circuitry may be operable to receive a digital output signal generated by the second ADC circuitry based on the single pulse and to output a differentiated output signal to the processing circuitry; and the processing circuitry may be operable to generate the predetermined second scaling factor based on the magnitude of the single pulse and the differentiated output signal.

The coulomb counter circuitry may comprise:

a first processing path comprising the ADC circuitry and the offset correction circuitry; and a second processing path comprising third ADC circuitry, and in the second mode of operation the coulomb counter circuitry may be operable to select the second processing path to generate a second signal indicative of a cumulative amount of charge transferred to the load.

According to a second aspect, the invention provides coulomb counter circuitry comprising:

analog to digital converter (ADC) circuitry configured to receive an input signal indicative of a current through a load;

accumulator circuitry configured to receive a digital output signal from the ADC circuitry and to generate an accumulator output signal indicative of a cumulative amount of charge transferred to the load; and correction circuitry configured to apply a correction to the accumulator output signal, wherein the coulomb counter circuitry is operative to receive, periodically, a reference signal indicative of a cumulative amount of charge transferred to the load, and wherein the correction signal is based on the received reference signal.

The reference signal may be received from a current sensing channel of a host device incorporating the coulomb counter circuitry.

According to a third aspect, the invention provides coulomb counter circuitry comprising:

delta-sigma analogue to digital converter (ADC) circuitry;

offset correction circuitry;

accumulator circuitry; and second ADC circuitry of higher resolution than the delta sigma ADC circuitry, wherein, in a calibration mode of operation, the coulomb counter circuitry is operative to generate an offset correction to be applied by the offset correction circuitry during subsequent operation in a coulomb counting mode of operation, wherein the offset correction is based at least in part on a signal output by the second ADC circuitry.

According to a fourth aspect, the invention provides an integrated circuit comprising coulomb counter circuitry according to the first, second or third aspect.

According to a fifth aspect, the invention provides a host device comprising coulomb counter circuitry according to the first, second or third aspect.

The host device may comprise a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console a VR or AR device, a mobile telephone, a portable audio player or other portable device.

BRIEF DESCRIPTION OF THE DRAWINGS

Embodiments of the invention will now be described, strictly by way of example only, with reference to the accompanying drawings, of which.

DETAILED DESCRIPTION

Figure 1:
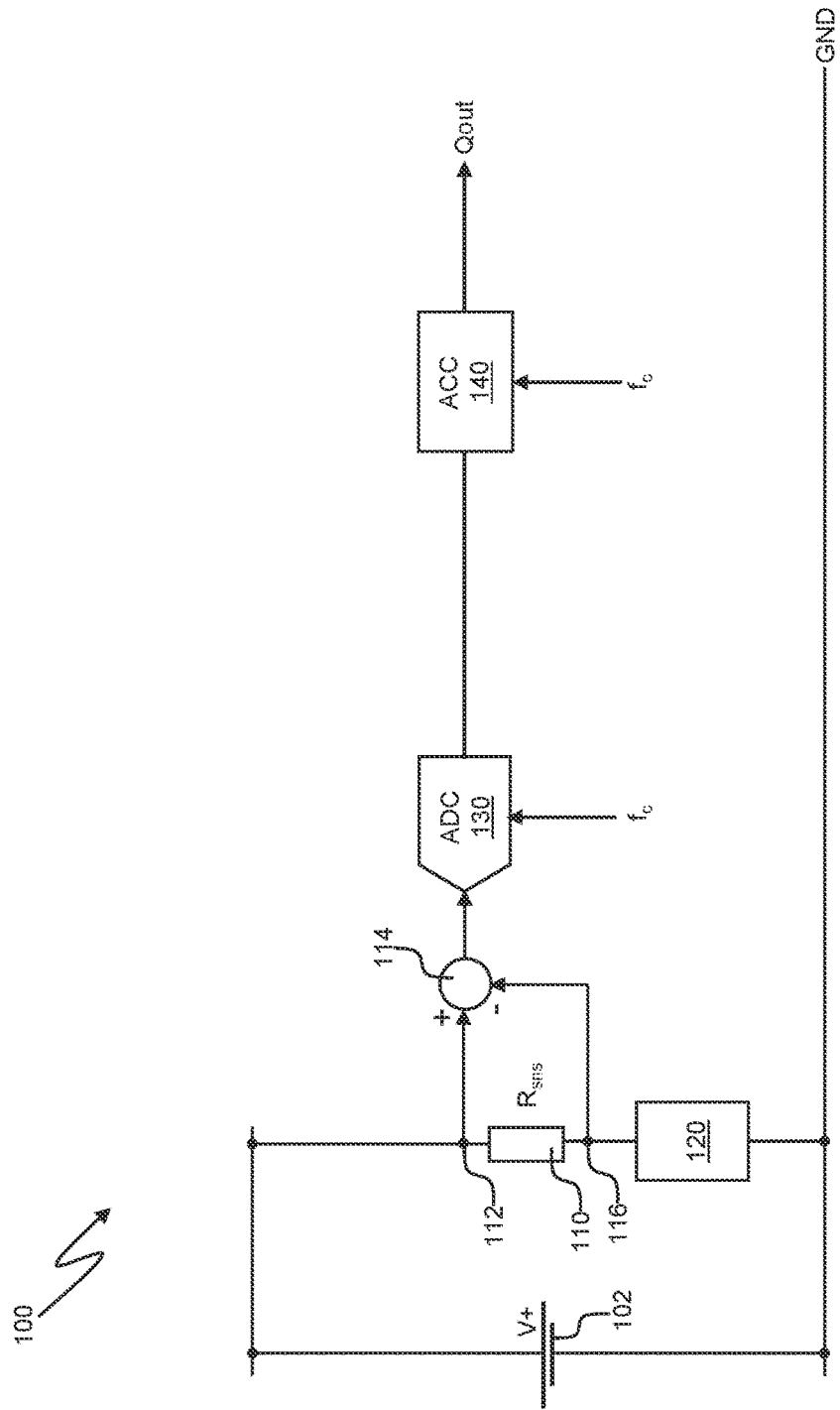
FIG. 1 is a is a schematic representation of example coulomb counter circuitry.

In a practical implementation of coulomb counter circuitry 100 of the kind shown in FIG. 1, the ADC circuitry 130 is not ideal. As will be understood by those of ordinary skill in the art, sources of non-ideality include gain error and offset error in the ADC circuitry 130. Offset error may be defined as the deviation of the transfer function of the ADC circuitry from an ideal ADC transfer function at the point of a transition from zero to the ADC's least significant bit (LSB) output. If this transition does not occur at an input value of 0.5 LSB, an offset error exists. Such offset error can give rise to inaccuracy in the calculation or estimation of a state of charge of a battery based on the digital output signal Qout.

Figure 2:
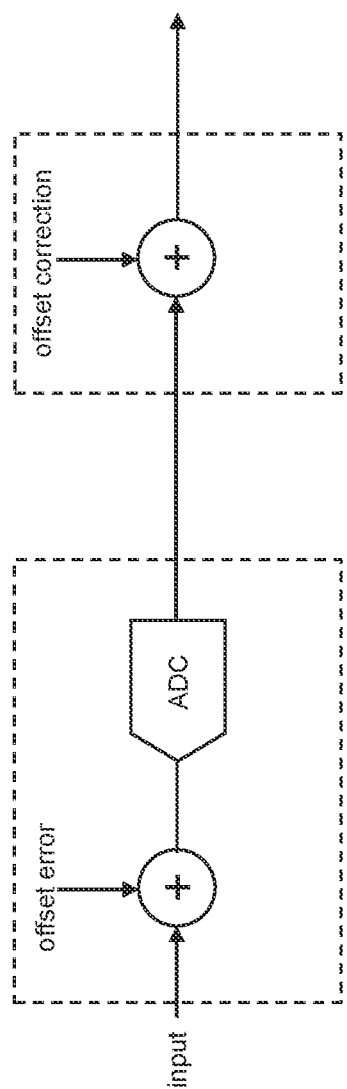
FIG. 2 is a schematic representation of a model of analog to digital converter (ADC) offset error and a model of correction of ADC offset error.

The offset error can be modelled as an error signal added to the analog input signal to ideal ADC circuitry, as shown schematically in FIG. 2. To correct the offset error an offset correction signal may be applied. This may be modelled as shown in FIG. 2 as a digital offset correction signal added digitally to the digital output signal of the ADC circuitry 130.

Figure 3:
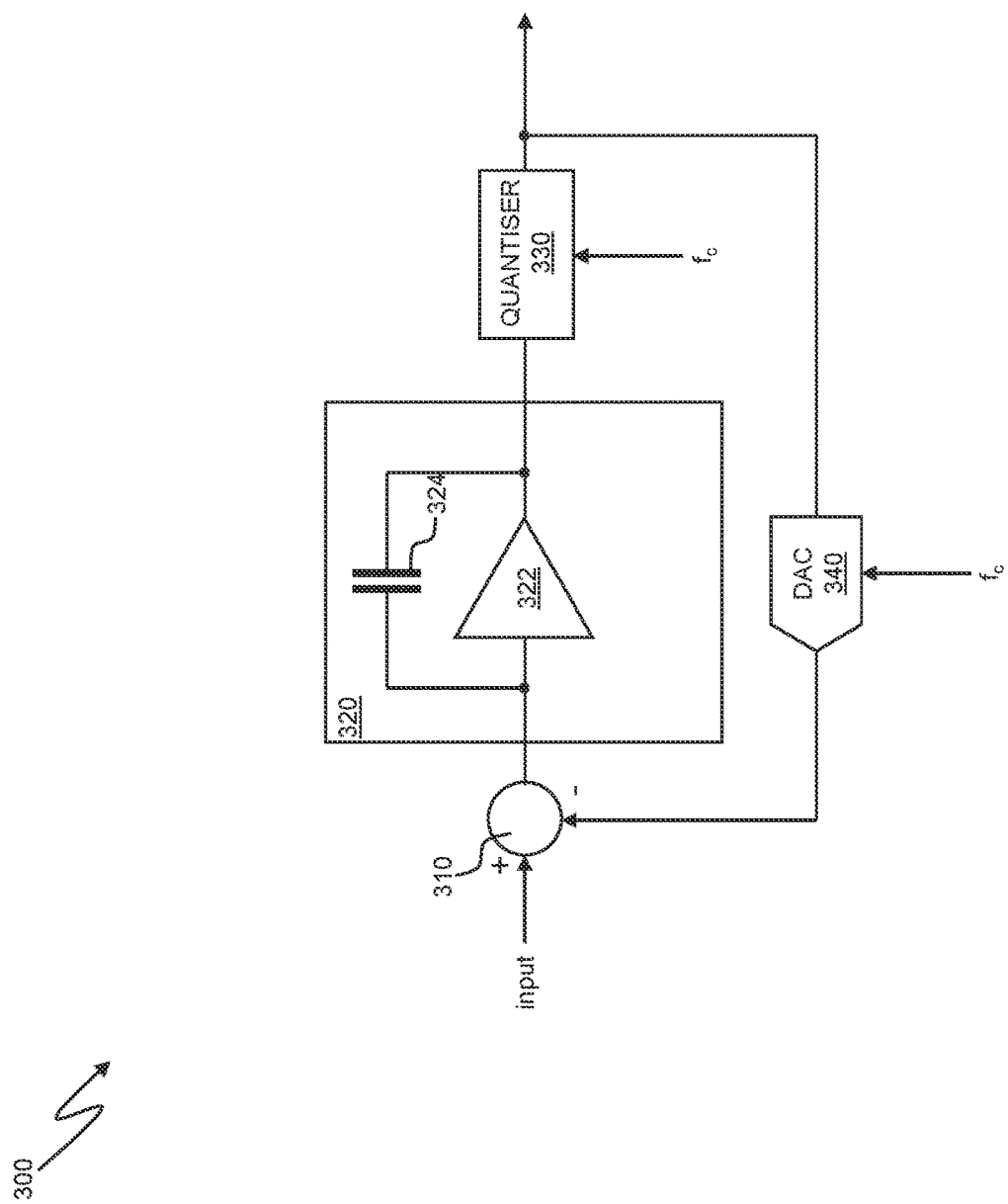
FIG. 3 is a schematic representation of delta sigma modulator circuitry for implementing the ADC circuitry of FIG. 1.

In some examples the ADC circuitry 130 may be implemented as delta-sigma modulator (DSM) circuitry. FIG. 3 is a schematic representation of delta sigma modulator circuitry for implementing the ADC circuitry of FIG. 1.

The DSM circuitry, shown generally at 300 in FIG. 3, includes subtractor circuitry 310, integrator circuitry 320, quantiser circuitry 330 and feedback digital to analog converter (DAC) circuitry 340.

The subtractor circuitry 310 is configured to receive, at a first input thereof, an analog input signal to be converted into a digital output signal. A second input of the subtractor circuitry 310 is coupled to an output of the feedback DAC circuitry 340 so as to receive an analog feedback signal. An output of the subtractor circuitry 310 is coupled to an input of the integrator circuitry 320.

The subtractor circuitry 310 is configured to subtract the analog feedback signal from the analog input signal, such that the signal output by the subtractor circuitry 310 to the integrator circuitry 320 represents the difference between the analog input signal and the analog feedback signal.

The integrator circuitry 320 in the illustrated example comprises operational amplifier circuitry 322 with a capacitor 324 coupled between an output and an input thereof.

An output of the integrator circuitry 320 is coupled to an input of the quantiser circuitry 330, so as to provide an analog integrator output signal to the quantiser circuitry 330.

The quantiser circuitry 330 provides a quantised signal as an output signal of the DSM 300. An output of the quantiser circuitry 330 is also coupled to an input of the feedback DAC circuitry 340.

The quantiser circuitry 330 and the feedback DAC circuitry 340 are sampled at a frequency $f_c$ Hz (e.g. in synchronisation with a clock signal at the frequency $f_c$ generated by a clock generator, not shown in FIG. 3).

As noted above, offset error in the ADC circuitry 130 (e.g. the DSM ADC circuitry 300 of FIG. 3) can give rise to inaccuracy in the calculation or estimation of a state of charge of a battery based on the digital output signal Qout. To minimise (or at least reduce) the effects of offset error, a calibration operation can be performed, as will now be described with reference to FIG. 4, which is a schematic representation of example coulomb counter circuitry with additional offset correction and calibration circuitry.

Figure 4:
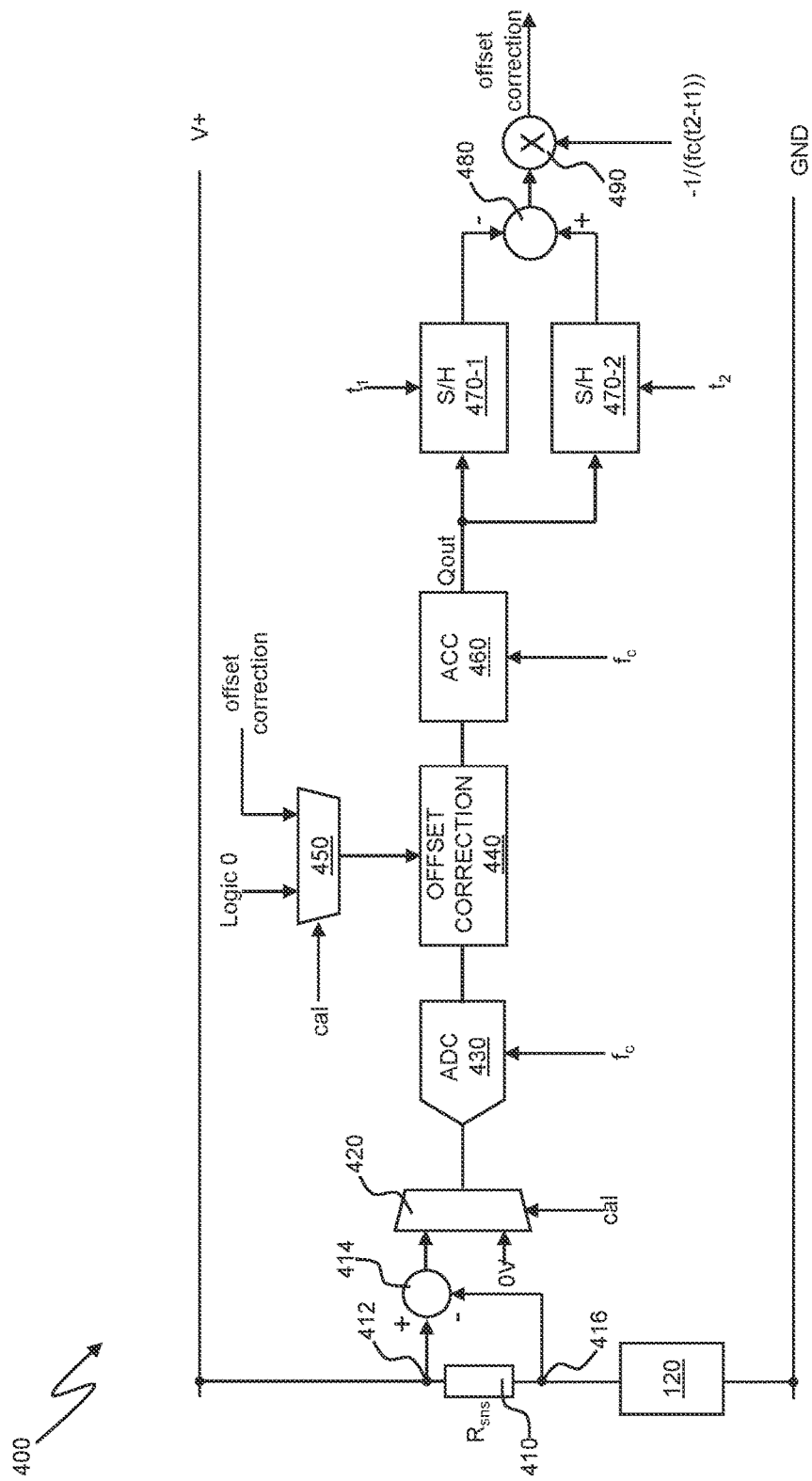
FIG. 4 is a representation of example coulomb counter circuitry with additional offset correction and calibration circuitry.

As shown generally at 400 in FIG. 4, the coulomb counter circuitry in this example includes a current sense resistor 410, subtractor circuitry 414 for supplying a subtractor output voltage indicative of a voltage across the current sense resistor 410, input multiplexer circuitry 420, ADC circuitry 430, offset correction circuitry 440, offset correction multiplexer circuitry 450, charge accumulator circuitry 460, respective first and second sample and hold circuitry 470-1, 470-2, subtractor circuitry 480 and multiplier circuitry 490.

The coulomb counter circuitry 400 is operable in a first, normal or coulomb counting, mode of operation and a second, calibration, mode of operation.

In the first, normal or coulomb counting, mode of operation, the ADC circuitry 430, offset correction circuitry 440 and charge accumulator circuitry 460 generate an offset-corrected output signal indicative of a cumulative amount of charge transferred to a load 120 from a positive supply rail V+ (which may receive a positive supply voltage from a battery).

In the second, calibration, mode of operation, the ADC circuitry 430, charge accumulator circuitry 460, first and second sample and hold circuitry 470-1, 470-2, subtractor circuitry 480 and multiplier circuitry 490 generate an offset correction signal for subsequent use by the coulomb counter circuitry 400 during operation in its first, normal or coulomb counting, mode of operation.

The current sense resistor 410 is coupled in series with the positive power supply rail V+, and the load 120 is coupled between the current sense resistor 410 and a ground rail.

In this example only a single load 120 is shown, but it will be appreciated that two or more loads (which may be coupled in parallel) may be supplied by the positive power supply rail V+.

A first node 412 coupled to a first terminal of the current sense resistor 410 is coupled to a first input of the subtractor circuitry 414 and a second node 416 is coupled to a second input of the subtractor circuitry 414. The subtractor circuitry 414 thus generates and outputs a voltage equal to a voltage across the current sense resistor 410 (and thus indicative of a current through the current sense resistor 410) to a first input of the input multiplexer circuitry 420. A second input of the input multiplexer circuitry 420 is coupled to a 0 V supply. The input multiplexer circuitry 420 is configured to selectively couple either its first input or its second input to its output in response to a calibration control signal cal received at a control input of the input multiplexer circuitry 420.

The output of the input multiplexer circuitry 420 is coupled to an input of the ADC circuitry 430. The ADC circuitry 430 is configured to convert an analog signal received at its input into a digital ADC output signal. The ADC circuitry 430 may be first-order DSM ADC circuitry of the kind described above with reference to FIG. 3, for example. An output of the ADC circuitry 430 is coupled to a first input of the offset correction circuitry 440 so as to supply the digital ADC output signal to the offset correction circuitry 440.

A second input of the offset correction circuitry is coupled to an output of the offset correction multiplexer circuitry 450. A first input of the offset correction multiplexer circuitry 450 receives a predefined offset correction signal (e.g. from a memory, not shown in FIG. 4), and a second input of the offset correction multiplexer circuitry 450 receives a constant logic 0 signal. The offset correction multiplexer circuitry 450 is configured to selectively couple either its first input or its second input to its output in response to the calibration control signal cal received at a control input of the offset correction multiplexer circuitry 450.

An output of the offset correction circuitry 440 is coupled to an input of the charge accumulator circuitry 460. The charge accumulator circuitry 460 is operative to receive an offset-corrected digital output signal from the offset correction circuitry 440 and to integrate it over time to generate a digital charge accumulator output signal Qout, representing the cumulative amount of charge transferred from the positive supply rail V+ to the load 120.

An output of the charge accumulator circuitry 460 is coupled to inputs of the respective first and second sample and hold circuitry 470-1, 470-2. The first sample and hold circuitry 470-1 is configured to sample the digital charge accumulator output signal Qout at a first time $t_1$, and the second sample and hold circuitry 470-2 is configured to sample the digital charge accumulator output signal Qout at a second time $t_2$.

The ADC circuitry 430 and the charge accumulator circuitry 460 are sampled at a frequency $f_c$ Hz (e.g. in synchronisation with a clock signal at the frequency $f_c$ generated by a clock generator, not shown in FIG. 4), such that the digital ADC output signal and the digital charge accumulator output signal Qout are updated once every $1/f_c$ seconds.

An output of the first sample and hold circuitry 470-1 is coupled to a first input of the subtractor circuitry 480, and an output of the second sample and hold circuitry 470-2 is coupled to a second input of the subtractor circuitry 480.

The subtractor circuitry 480 is configured to subtract a signal received at its first input from a signal received at its second input, such that a difference signal output by the subtractor circuitry 480 to a first input of the multiplier circuitry 490 is indicative of the difference between the digital charge accumulator output signal Qout at the second time $t_2$ and the digital charge accumulator output signal at the first time $t_1$.

The multiplier circuitry 490 is configured to receive, at a second input thereof, a first scaling factor signal representative of a predetermined first scaling factor, and to multiply the signal received at its first input by the predetermined first scaling factor to generate the offset correction signal, which may be stored (e.g. in a memory, not shown in FIG. 4) for use in correcting ADC offset during subsequent operation of the coulomb counter circuitry 400 in its first, normal or coulomb counting, mode of operation. The predetermined first scaling factor in this example is equal to $-1/(f_c(t_2-t_1))$ and compensates for the time scales used in generating the offset correction signal.

In use of the coulomb counter circuitry 400 in its second, calibration, mode of operation, the calibration control signal cal is asserted (e.g. the calibration control signal is set to a digital high or 1 value), causing the input multiplexer circuitry 420 to select its second input, thus outputting a voltage of 0v to the input of the ADC circuitry 430. (In alternative implementations the same effect can be achieved without the input multiplexer circuitry 420 by setting the load current to 0, e.g. by decoupling the load 120 from the positive power supply rail V+).

The assertion of the calibration control signal cal also causes the offset correction multiplexer circuitry 450 to select its second input, such that no input is provided to the offset correction circuitry 440.

Thus, no offset correction is applied to the output of the ADC circuitry 430, and so the digital ADC output signal output by the ADC circuitry 430 is indicative of only the ADC offset error.

The charge accumulator circuitry 460 integrates the digital ADC output signal over time to generate the digital charge accumulator output signal Qout.

The first sample and hold circuitry 470-1 samples the digital charge accumulator output signal Qout at the first time $t_1$ and the second sample and hold circuitry 470-2 samples the digital charge accumulator output signal Qout at the second time $t_2$.

The subtractor circuitry 480 generates the difference signal, which is output to the multiplier circuitry 490 where it is multiplied by the scaling factor signal to generate the offset correction signal, which can be stored (e.g. in memory) for later use by the coulomb counter circuitry 400 during subsequent operation in its first, normal or coulomb counting, mode of operation.

In use of the coulomb counter circuitry 400 in its first, normal or coulomb counting, mode of operation, the calibration control signal cal is de-asserted (e.g. the calibration control signal is set to a digital low or 0 value), causing the input multiplexer circuitry 420 to select its first input, such that the voltage at the node 412 is output to the input of the ADC circuitry 430.

The de-assertion of the calibration control signal cal causes the offset correction multiplexer circuitry 450 to select its first input, at which the offset correction signal that was generated and stored during a previous calibration operation of the coulomb counter circuitry 400, is received. The offset correction circuitry 440 thus receives the offset correction signal, and applies it (e.g. digitally adds it) to the digital ADC output signal to correct or compensate (at least partially) for ADC offset error in the digital ADC output signal.

This offset-corrected digital output signal is output to the charge accumulator circuitry 460, which integrates the offset-corrected digital output signal to generate an offset-corrected digital charge accumulator output signal Qout indicative of the cumulative amount of charge transferred from the positive supply rail V+ to the load 120, which may be used, e.g. by downstream processing circuitry (not shown) to calculate, estimate or otherwise determine a state of charge of a battery which supplies the positive supply rail V+.

Calibration of the coulomb counter circuitry 400 as described above may take an undesirably long time, particularly in examples in which the ADC circuitry 430 is implemented as first order delta-sigma modulator circuitry, because offset error is low and the resolution of such ADC circuitry is relatively low, which means that quantisation noise is relatively high, such that a long averaging time is required to suppress the quantisation noise and make the offset error detectable. As will be appreciated, a long calibration time adds undesirable cost to the production test process.

Figure 5:
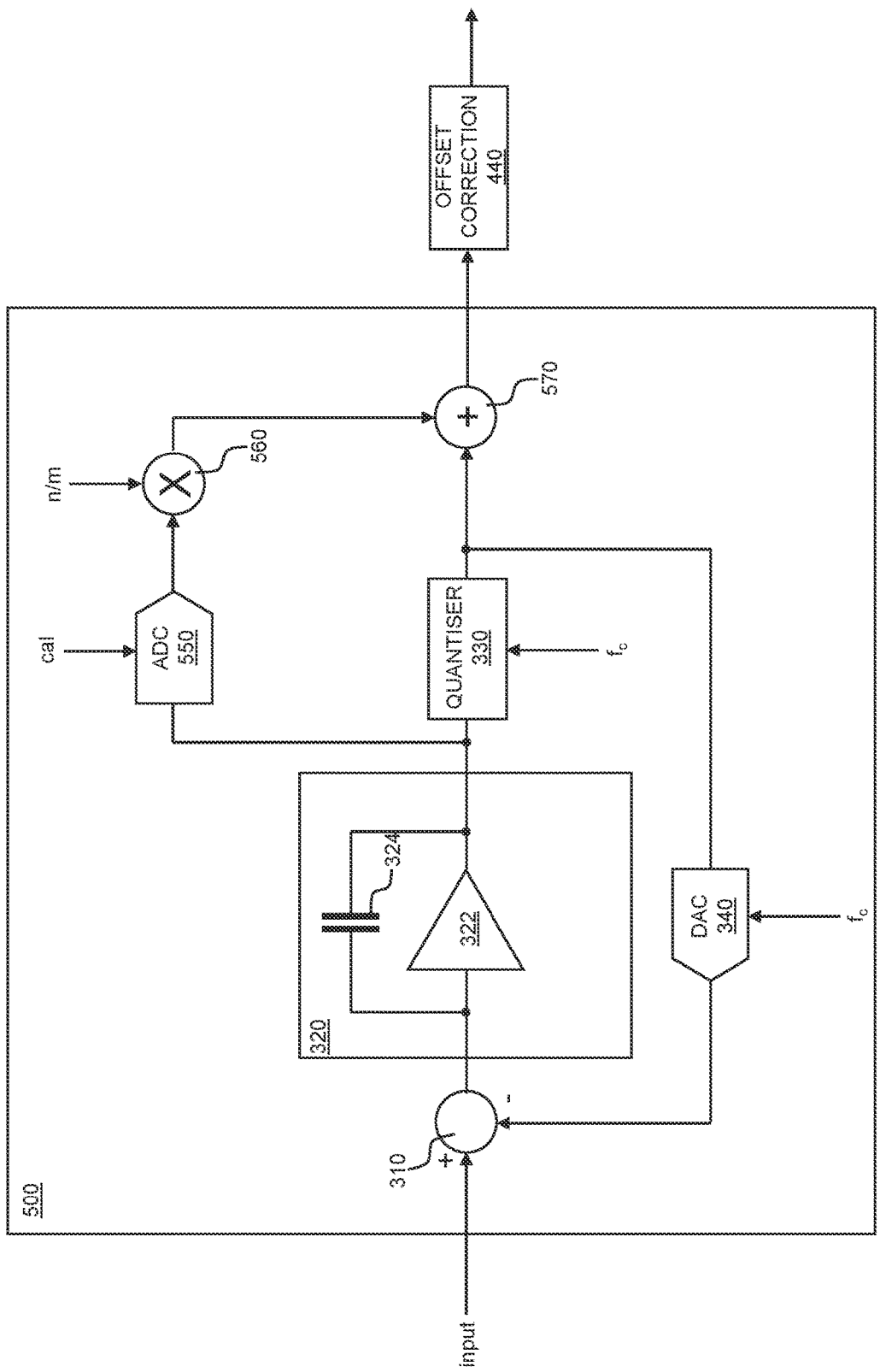
FIG. 5 is a schematic representation of an example of alternative ADC circuitry that can be used in place of the ADC circuitry of the coulomb counter circuitry of FIG. 4 to implement enhanced coulomb counter circuitry that is capable of faster calibration than the coulomb counter circuitry of FIG. 4.

FIG. 5 is a schematic representation showing an example of alternative ADC circuitry that can be used in place of the ADC circuitry 430 in the coulomb counter circuitry 400 of FIG. 4 to implement enhanced coulomb counter circuitry that is capable of faster calibration than the coulomb counter circuitry 400 of FIG. 4.

It is to be understood that this enhanced coulomb counter circuitry includes all of the elements shown in FIG. 4 and described above, though for reasons of clarity only the offset correction circuitry 440 is shown in FIG. 5.

The alternative ADC circuitry, shown generally at 500, includes many of the same elements as the delta sigma modulator ADC circuitry 300 of FIG. 3, and so like elements are denoted by like reference numerals in FIGS. 3 and 5, and will not be described again in detail here, for reasons of brevity.

Thus, the alternative ADC circuitry 500 includes subtractor circuitry 310, integrator circuitry 320, quantiser circuitry 330 and digital to analog converter (DAC) circuitry 340 configured as in the delta sigma modulator ADC circuitry 300.

The alternative ADC circuitry 500 additionally includes second ADC circuitry 550, digital multiplier circuitry 560 and digital adder circuitry 570.

The second ADC circuitry 550 is configured to have a higher resolution than the quantiser circuitry 330. In some examples the second ADC circuitry 550 may be, for example, successive approximation register (SAR) ADC circuitry. SAR ADC circuitry is beneficial because it is generally relatively small, but it will be appreciated by those of ordinary skill in the art that other types of ADC circuitry may also be used.

An input of the second ADC circuitry 550 is coupled to an output of the integrator circuitry 320 so as to receive the analog integrator output signal. A control input of the ADC circuitry 550 receives the calibration control signal cal, so as to selectively enable the ADC circuitry 550 in operation of the coulomb counter circuitry in its second, calibration, mode of operation.

An output of the ADC circuitry 550 is coupled to a first input of the digital multiplier circuitry 560. A second input of the digital multiplier circuitry receives a second scaling factor signal representative of a predetermined second scaling factor n/m. The predetermined second scaling factor n/m is dependent upon the gain of the DAC circuitry 340, integrator circuitry 320 and ADC circuitry 550. The second scaling factor can be determined prior to use of the coulomb counter circuitry, as will be explained in detail below.

A first input of the digital adder circuitry 570 is coupled to an output of the quantiser circuitry 330, and a second input of the digital adder circuitry 570 is coupled to an output of the digital multiplier circuitry 560. An output of the digital adder circuitry 570 is coupled to an input of the offset correction circuitry 440, which in turn outputs an offset-corrected digital output signal is output to the charge accumulator circuitry 460 as described above with reference to FIG. 4.

In operation of the enhanced coulomb counter circuitry in a second, calibration, mode of operation, the calibration control signal cal is asserted, thus enabling the ADC circuitry 550. The ADC circuitry 550 is thus operative to convert the analog integrator output signal into a digital ADC output signal of a higher resolution than the quantised signal output by the quantiser circuitry 330.

The digital ADC output signal is received by the digital multiplier circuitry 560, which applies the predetermined second scaling factor to generate a scaled version of the digital ADC output signal. This scaled version of the digital ADC output signal is output to the digital adder circuitry 570.

The digital adder circuitry 570 adds the scaled version of the digital ADC output signal to the quantiser output signal, and outputs the resulting combined signal to the offset correction circuitry 440. As will be appreciated, adding the scaled version of the digital ADC output signal to the quantiser output signal increases the resolution of the signal that is output to the downstream circuitry of the enhanced coulomb counter circuitry.

As the calibration control signal cal is asserted in the second, calibration, mode of the enhanced coulomb counter circuitry, no offset correction is applied by the offset correction circuitry 440, and so the combined signal output by the digital adder circuitry 570 is passed unchanged to the charge accumulator circuitry 460.

The calibration process then proceeds as described above with reference to FIG. 4, with the first and second sample and hold circuitry 470-1, 470-2 sampling the digital charge accumulator output signal Qout at respective first and second times $t_1$, $t_2$ and the subtractor circuitry 480 generating a difference signal which is multiplied by the scaling factor signal by the multiplier circuitry 490 to generate the offset correction signal. As in the coulomb counter circuitry 400, the offset correction signal can be stored (e.g. in memory) for later use by the enhanced coulomb counter circuitry during operation in its first, normal mode of operation.

The use of the second ADC circuitry 550 in the second, calibration, mode of operation permits a higher resolution digital signal indicative of the load current to be supplied to the charge accumulator circuitry 460, which reduces the time required to generate the offset correction signal.

Operation of the enhanced coulomb counter circuitry in its first, normal, mode of operation is as described above with reference to FIG. 4, with the offset correction signal generated during a prior calibration operation being applied by the offset correction circuitry 440 to generate an offset-corrected digital output signal which is output to the charge accumulator circuitry 460, which in turn generates an offset-corrected digital charge accumulator output signal Qout indicative of the cumulative amount of charge transferred from the positive supply rail V+ to the load 120. This offset-corrected digital charge accumulator output signal Qout may be used, e.g. by downstream processing circuitry (not shown) to calculate, estimate or otherwise determine a state of charge of a battery which supplies the positive supply rail V+.

Figure 6:
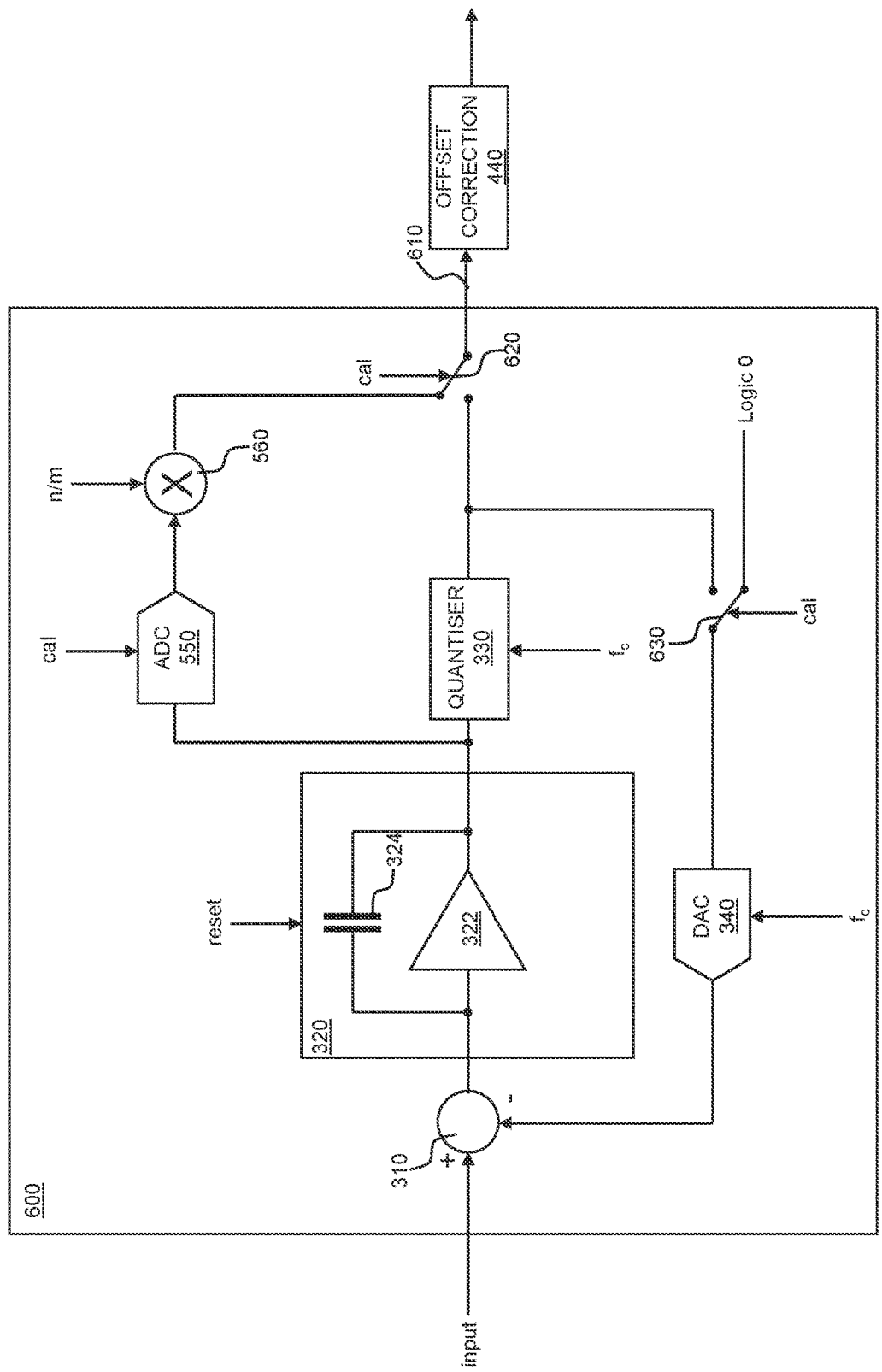
FIG. 6 is a schematic representation of a further example of alternative ADC circuitry that can be used in place of the ADC circuitry of the coulomb counter circuitry of FIG. 4 to implement enhanced coulomb counter circuitry that is capable of faster calibration than the coulomb counter circuitry of FIG. 4.

FIG. 6 is a schematic representation showing an example of further alternative ADC circuitry that can be used in place of the ADC circuitry 430 in the coulomb counter circuitry 400 of FIG. 4 to implement enhanced coulomb counter circuitry that is capable of faster calibration than the coulomb counter circuitry 400 of FIG. 4.

Again, it is to be understood that this enhanced coulomb counter circuitry includes all of the elements shown in FIG. 4 and described above, though for reasons of clarity only the offset correction circuitry 440 is shown in FIG. 6.

The further alternative ADC circuitry, shown generally at 600 in FIG. 6, includes many of the same elements as the alternative ADC circuitry 500 of FIG. 5, and so like elements are denoted by like reference numerals in FIGS. 5 and 6.

The further alternative ADC circuitry 600 differs from the alternative ADC circuitry 500 of FIG. 5 in that it omits the digital adder circuitry 570. Instead, a first switch or multiplexer 620 is provided for selectively coupling the output of the digital multiplier circuitry 560 or the output of the quantiser circuitry 330 to an output node 610 of the ADC circuitry 600.

Further, the input of the DAC circuitry 340 can be selectively decoupled from the output of the quantiser circuitry 330 and coupled to a constant logic 0 signal. In the illustrated example a second switch or multiplexer 630 is provided to permit the input of the DAC circuitry 340 to be selectively coupled to either the output of the quantiser circuitry 330 or the constant logic 0 signal, but again those of ordinary skill in the art will appreciated that other ways of achieving this selective coupling are possible.

In use of enhanced coulomb counter circuitry incorporating the ADC circuitry 600 of FIG. 6 in a second, calibration, mode of operation, the calibration control signal cal is asserted, which causes the output of the quantiser circuitry 330 to be decoupled from the output node 610 and from the input of the DAC circuitry 340, and the input of the DAC circuitry to be coupled to the constant logic 0 signal. For example, the calibration control signal may cause the first switch 620 to adopt the configuration shown in FIG. 6 to decouple the output of the quantiser circuitry 330 from the output node 610 and to couple the output of the multiplier circuitry 560 to the output node 610, and the second switch 630 to adopt the configuration shown in FIG. 6 to couple the input of the DAC circuitry 340 to the constant logic 0 signal.

Coupling the input of the DAC circuitry 340 to the constant logic 0 signal ensures that the analog DAC output signal received at the second input of the subtractor circuitry 310 makes no contribution to the signal received at the input of the integrator circuitry 320 from the subtractor circuitry 310, such that only the offset error is present in the analog integrator output signal output by the integrator circuitry 320.

The ADC circuitry 550 is enabled by the calibration control signal, such that a scaled version of the ADC output signal is supplied to the output node 610. As the output of the quantiser circuitry 330 is decoupled from the output node 610, the signal at the output node does not contain any component derived from the signal output by the quantiser circuitry 330, but is instead comprised only of the higher resolution scaled DAC output signal.

As in the calibration control signal cal is asserted in the second, calibration, mode of the enhanced coulomb counter circuitry, no offset correction is applied by the offset correction circuitry 440, and so the scaled DAC output signal is passed unchanged to the charge accumulator circuitry 460.

The calibration process then proceeds essentially as described above with reference to FIG. 4, with the first and second sample and hold circuitry 470-1, 470-2 sampling the digital charge accumulator output signal Qout at respective first and second times $t_1$, $t_2$ and the subtractor circuitry 480 generating a difference signal which multiplied by the scaling factor signal by the multiplier circuitry 490 to generate the offset correction signal. As in the coulomb counter circuitry 400, the offset correction signal can be stored (e.g. in memory) for later use by the enhanced coulomb counter circuitry during operation in its first, normal mode of operation. To ensure that the integrator circuitry 320 does not saturate before the end of the calibration (at time $t_2$), the integrator circuitry 320 should be reset before the calibration process begins (at time $t_1$).

In the ADC circuitry 500, 600 of FIGS. 5 and 6, a predefined scaling factor n/m is applied to the digital signal output by the ADC circuitry 550. This predefined scaling factor should be determined prior to its use in a calibration process performed by enhanced coulomb counter circuitry incorporating the ADC circuitry 500, 600.

The scaling factor n/m is dependent upon the gain of the DAC circuitry 340, the gain of the integrator circuitry 320 and the gain of the ADC circuitry 550, and can be determined without requiring external instruments.

Figure 7:
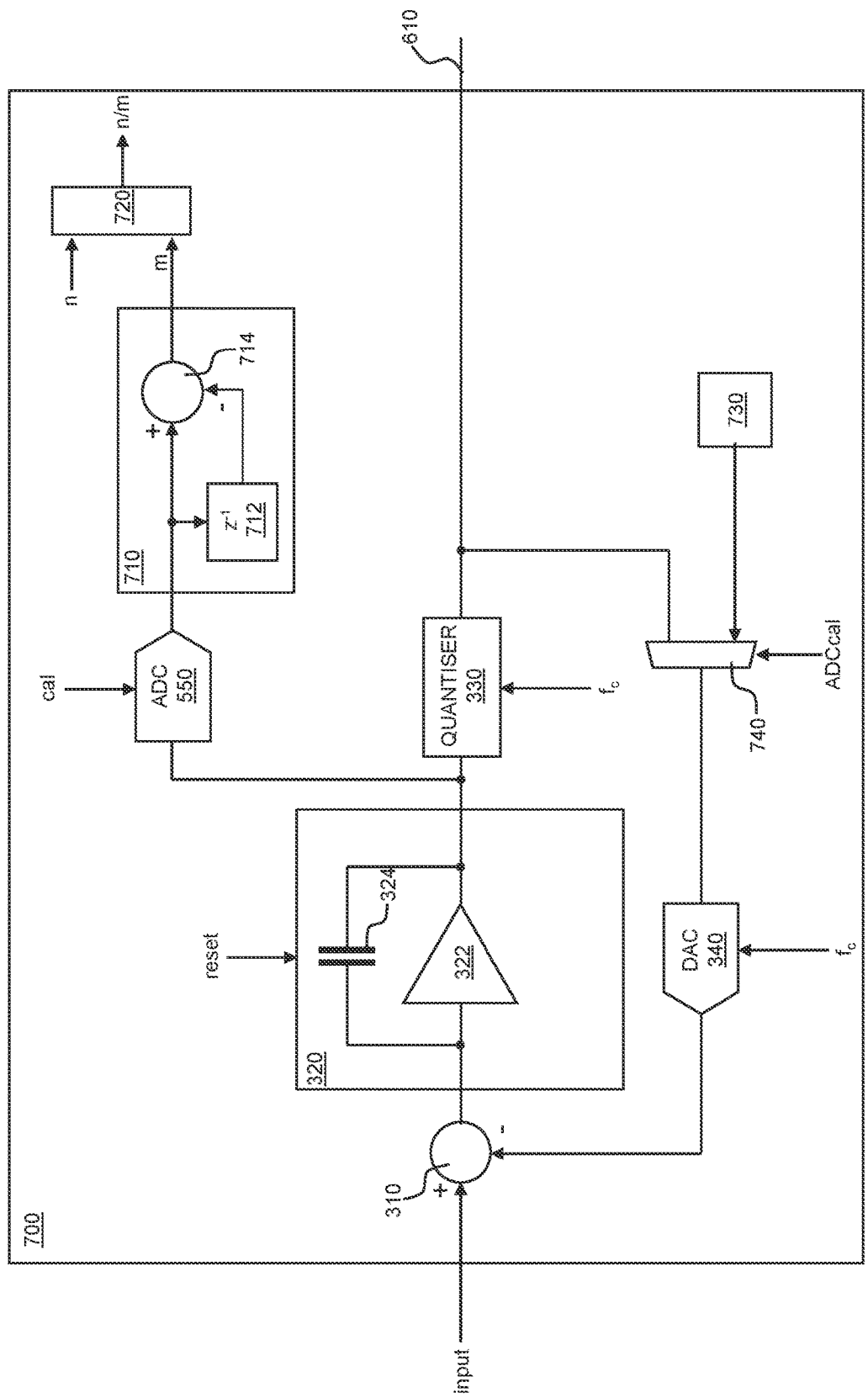
FIG. 7 is a schematic diagram showing ADC circuitry with additional circuitry that may be used to determine a scaling factor that is used in the ADC circuitry of FIG. 5 or FIG. 6.

FIG. 7 is a schematic diagram showing ADC circuitry with additional circuitry that may be used to determine the scaling factor n/m.

The ADC circuitry, shown generally at 700 in FIG. 7, includes many of the same elements as the alternative ADC circuitry 500, 600 of FIGS. 5 and 6, and so like elements are denoted by like reference numerals in FIGS. 5, 6 and 7 and will not be described again in detail here, for the sake of clarity and brevity.

The ADC circuitry 700 includes digital differentiator circuitry 710 which can be coupled to the output of the ADC circuitry 550 in a scaling factor calibration mode of operation of the ADC circuitry 700.

The digital differentiator circuitry 710 includes digital delay circuitry 712 and subtractor circuitry 714. The output of the ADC circuitry 550 is coupled to an input of the digital differentiator circuitry 710, which is in turn coupled to an input of the digital delay circuitry 712 and to a first input of the subtractor circuitry 714. An output of the digital delay circuitry 712 is coupled to a second input of the subtractor circuitry 714.

The subtractor circuitry 714 is configured to subtract a digitally delayed signal output by the digital delay circuitry 712 (which is a delayed version of the digital signal output by the ADC circuitry 550) from the digital output signal output by the ADC circuitry 550 so as to generate the m component of the scaling factor n/m. An output of the digital differentiator circuitry 710 is coupled to an input of processing circuitry 720 so as to supply the n component to the processing circuitry 720.

The ADC circuitry 700 further includes pulse generator circuitry 730 operative to generate a single pulse signal of amplitude n, which can be supplied to the input of the DAC circuitry 340. To this end, the ADC circuitry 700 in the illustrated example includes multiplexer circuitry 740 having a first input coupled to the output of the quantiser circuitry 330, a second input coupled to the output of the pulse generator circuitry 730 and an output coupled to the input of the DAC circuitry 340. A control input of the multiplexer circuitry 740 is configured to receive an ADC calibration control signal ADCcal.

In operation of the ADC circuitry 700 to determine the scaling factor n/m, the calibration control signal cal is asserted to enable the ADC circuitry 550 and the ADC calibration control signal ADCcal is also asserted to cause the multiplexer circuitry 740 to select its second input, thereby coupling the output of the pulse generator circuitry 730 to the input of the DAC circuitry 340.

The input of the subtractor circuitry 310 is set to 0 (e.g. is coupled to a 0V supply), and a single pulse of amplitude n is output by the pulse generator circuitry 730. This pulse propagates through the DAC circuitry 340, integrator circuitry 320, ADC circuitry 550 and digital differentiator circuitry 710 to generate a differentiated output signal which represents the m component of the scaling factor n/m, which is output by the digital differentiator circuitry 710 to the processing circuitry 720.

The processing circuitry 720 also receives a signal indicative of the amplitude n of the pulse, and uses this signal and the m component output by the digital differentiator circuitry 710 to determine the scaling factor n/m, which can be stored in memory for subsequent use during the first, calibration, mode of enhanced coulomb counter circuitry that incorporates the ADC circuitry 700.

In the enhanced coulomb counter circuitry described above (where the ADC circuitry 430 of the coulomb counter circuitry is implemented by the ADC circuitry 500, 600, 700 of FIG. 5, 6 or 7), operation in the second, calibration, mode of operation interrupts the normal coulomb counting function of the circuitry—i.e., the enhanced coulomb counter circuitry cannot simultaneously operate in its first, normal or coulomb counting, mode of operation and its second, calibration, mode of operation. Thus, such enhanced coulomb counter circuitry is best suited to applications in which either: calibration is not required; calibration is performed at production test and a value for the offset correction signal is stored in a memory (e.g. a one-time programmable memory); a situation exists in normal use in which the enhanced coulomb counter circuitry is powered on but coulomb counting is not required, e.g. a power on reset (POR) condition; or any error (e.g. in a reported battery SOC) caused by the interruption to coulomb counting is tolerable, e.g. during a period of light battery use.

In some applications it may be necessary or desirable to perform calibration of coulomb counter circuitry at a time when the normal coulomb counting function of the coulomb counter circuitry should not or cannot be interrupted, e.g., if the ADC offset error changes with time or temperature.

Figure 8:
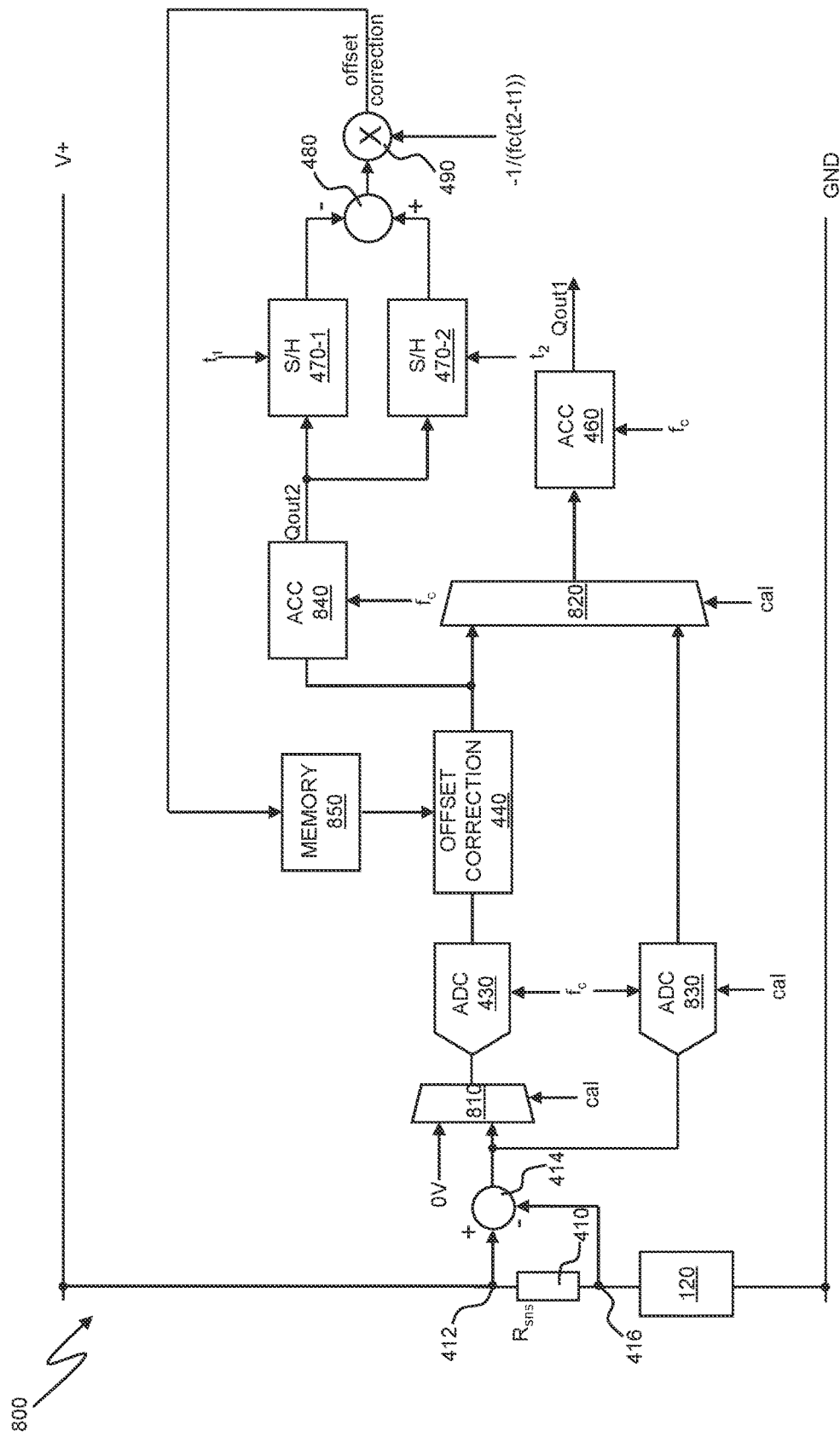
FIG. 8 is a schematic representation of alternative coulomb counter circuitry in which a normal coulomb counting function can be maintained while calibration of the ADC offset is performed.

FIG. 8 is a schematic representation of alternative coulomb counter circuitry in which the normal coulomb counting function can be maintained while calibration of the ADC offset is performed.

The coulomb counter circuitry of FIG. 8 (shown generally at 800) includes some of the same elements as the coulomb counter circuitry of FIG. 4, and so like elements are denoted by like reference numerals in FIGS. 4 and 8 and will not be described again in detail here, for the sake of clarity and brevity.

The coulomb counter circuitry 800 includes first multiplexer circuitry 810 having a first input coupled to the output of the subtractor circuitry 414 and a second input coupled to a 0V supply. An output of the first multiplexer circuitry 810 is coupled to an input of a first processing path comprising the ADC circuitry 430 and offset correction circuitry 440. The first multiplexer circuitry 810 is configured to receive a calibration control signal cal at a control input thereof and to selectively couple its first input or its second input to its output based on a state (asserted or de-asserted) of the calibration control signal cal.

As in the coulomb counter circuitry 400 of FIG. 4, an output of the ADC circuitry 430 is coupled to an input of the offset correction circuitry 440. An output of the offset correction circuitry 440 is coupled to a first input of second multiplexer circuitry 820. The second multiplexer circuitry 820 is configured to receive the calibration control signal cal at a control input thereof and to selectively couple its first input or its second input to its output based on a state (asserted or de-asserted) of the calibration control signal cal. An output to the second multiplexer circuitry 820 is coupled to an input of first charge accumulator circuitry 460.

The first processing path further includes second charge accumulator circuitry 840 having an input that is coupled to an output of the offset correction circuitry 440.

An output of the second charge accumulator circuitry 840 is coupled to respective inputs of first and second sample and hold circuitry 470-1, 470-2. Outputs of the first and second sample and hold circuitry 470-1, 470-2 are coupled to respective first and second inputs of subtractor circuitry 480. An output of the subtractor circuitry 480 is coupled to a first input of multiplier circuitry 490, and a second input of the multiplier circuitry 490 is configured to receive a first scaling factor signal representative of a predetermined first scaling factor. The first and second sample and hold circuitry 470-1, 470-2, subtractor circuitry 480 and multiplier circuitry 490 are structurally and functionally the same as the equivalent elements of the circuitry 400 of FIG. 4 and thus will not be described again in detail here.

An output of the multiplier circuitry 490 is coupled to a memory 850 such that an offset correction signal or value output by the multiplier circuitry 490 can be stored in the memory 850 for use in by the offset correction circuitry 440 in use of the circuitry 800 in a first, normal, mode of operation, as described below.

The coulomb counter circuitry 800 further includes a second processing path comprising third ADC circuitry 830. The third ADC circuitry 830 has an input coupled to the output of the subtractor circuitry 414 and an output coupled to a second input of the second multiplexer circuitry 820. The third ADC circuitry 830 is configured to be selectively activated based on the state (asserted or de-asserted) of the calibration control signal cal.

In operation of the coulomb counter circuitry 800 in a first, normal, mode of operation, the calibration control signal cal is de-asserted, such that the first multiplexer circuitry couples its first input to its output, thereby coupling the input of the ADC circuitry 430 to the output of the subtractor circuitry 414 such that a voltage indicative of a current through the load 120 is received at the input of the ADC circuitry 430.

The de-asserted calibration control signal causes the second multiplexer circuitry 820 to couple its first input to its output, such that an offset-corrected ADC output signal is supplied to the output of the second multiplexer circuitry 820, which in turn supplies the offset-corrected ADC output signal to the first accumulator circuitry, which outputs a digital charge accumulator output signal QOut1. The third ADC circuitry 830 is deactivated by the de-assertion of the calibration control signal.

The coulomb counter circuitry 800 thus operates in essentially the same manner as the coulomb counter circuitry 400 of FIG. 4 to generate an offset-corrected output signal Qout1, indicative of the cumulative amount of charge transferred from the positive supply rail V+ to the load 120, at the output of the first charge accumulator circuitry 460. This offset-corrected output signal Qout1 may be used, e.g. by downstream processing circuitry (not shown) to calculate, estimate or otherwise determine a state of charge of a battery which supplies the positive supply rail V+.

In operation of the coulomb counter circuitry 800 in a second, calibration, mode of operation, the calibration control signal cal is asserted, such that the first multiplexer circuitry 810 couples its second input to its output, thereby coupling the input of the ADC circuitry 430 to the 0V supply.

The third ADC circuitry 830 is activated in response to the asserted calibration control signal, and (because its input is coupled to the output of the subtractor circuitry 414) the third ADC circuitry 830 receives the voltage indicative of a current through the load 120 and outputs a digital representation of this voltage to the second input of the second multiplexer circuitry 820.

The asserted calibration control signal causes the second multiplexer circuitry 820 to couple its second input to its output, such that the digital signal output by the third ADC circuitry 830 is supplied to the output of the second multiplexer circuitry 820 and is in turn received by the first charge accumulator circuitry 460. The first charge accumulator circuitry thus outputs an output signal Qout1, indicative of the cumulative amount of charge transferred from the positive supply rail V+ to the load 120.

The coulomb counter circuitry 800 is thus able to continue to generate a digital charge accumulator output signal Qout1 (without any offset correction) indicative of the cumulative amount of charge transferred from the positive supply rail V+ to the load 120, based on the digital signal output by the third ADC circuitry 830, while a calibration is performed based on the output of the charge accumulator circuitry 460 as described above with reference to FIG. 4, to determine the offset correction signal to be applied by the offset correction.

This digital charge accumulator output signal Qout may be used, e.g. by downstream processing circuitry (not shown) to calculate, estimate or otherwise determine a state of charge of a battery which supplies the positive supply rail V+ while the calibration process is performed.

In some examples the third ADC circuitry 830 may be of reduced performance (e.g. in terms of resolution, power consumption, accuracy or the like) in comparison to the ADC circuitry 430, because the third ADC circuitry 830 may be used infrequently and any error introduced as a result of the use of the third ADC circuitry 830 are small compared to the total accumulated charge transferred to the load 120. The ADC circuitry 430 may be, for example, ADC circuitry 500, 600, 700 of the kind described above with reference to FIG. 5, 6 or 7.

In some applications it may be possible to use an existing "golden reference" to perform a background calibration or compensation process for coulomb counter circuitry. For example, some host devices (i.e. devices that incorporate coulomb counter circuitry) may include current sense circuitry for sensing a current through a load. Such current sense circuitry may be activated periodically to provide a reference signal to assist in correcting for error in the output of the coulomb counter circuitry, as will now be described with reference to FIG. 9, which is a schematic representation of a system for correcting (at least partially) for error in a coulomb counter.

Figure 9:
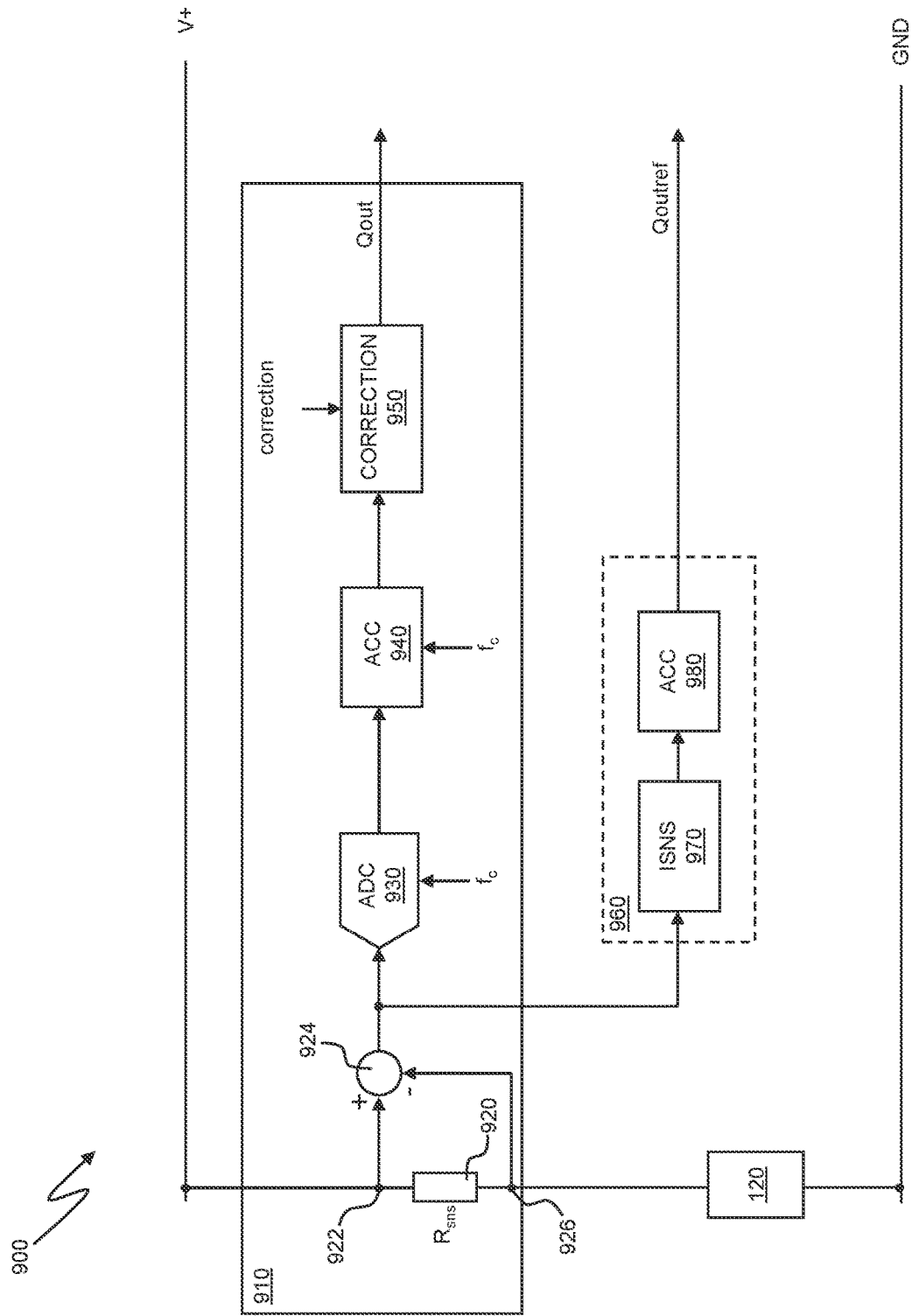
FIG. 9 is a schematic representation of a system for correcting (at least partially) for error in a coulomb counter.

As shown generally at 900 in FIG. 9, the system comprises coulomb counter circuitry 910 including a current sense resistor 920 coupled in series between a positive power supply V+ and a load 120 (which does not form part of the system).

In this example only a single load 120 is shown, but it will be appreciated that two or more loads (which may be coupled in parallel) may be supplied by the positive power supply rail V+.

A first node 922 coupled to a first terminal of the current sense resistor 920 is coupled to first input of subtractor circuitry 924 and a second node 926 coupled to a second terminal of the current sense resistor 920 is coupled to a second input of the subtractor circuitry 924. The subtractor circuitry 924 is configured to subtract a voltage at the second node 926 from a voltage at the first node 922 and output a difference voltage (which is equal to a voltage across the current sense resistor 920) to an input of analog to digital converter (ADC) circuitry 930.

In this example the ADC circuitry 930 has a single-ended input, but it will be appreciated by those of ordinary skill in the art that differential ADC circuitry could equally be used. In such an arrangement, the first node 922 is coupled to a first input of the differential ADC circuitry and the second node 926 is coupled to a second input of the differential ADC circuitry, such that the differential voltage between the inputs of the differential ADC circuitry is equal to the voltage across the current sense resistor 920.

An output of the ADC circuitry 930 is coupled to an input charge accumulator circuitry 940, and an output of the charge accumulator circuitry 940 is coupled to an input of correction circuitry 950. The ADC circuitry 930 and the charge accumulator circuitry 940 are sampled at a frequency $f_c$ Hz (e.g. in synchronisation with a clock signal at the frequency $f_c$ generated by a clock generator, not shown in FIG. 9).

The system 900 further includes a current sense channel 960 comprising current sense circuitry 970 (which may include, for example, ADC circuitry) having an input coupled to the output of the subtractor circuitry 924 and an output coupled to accumulator circuitry 980. In some examples the current sense channel 960 may be an existing current sense channel of a host device incorporating the system 900, while in other examples the current sense channel 960 may be a dedicated current sense channel for the coulomb counter circuitry 910.

The current sense channel 960 is a high accuracy channel that is calibrated (e.g. during a production test process during manufacture) so as to have a small offset and an accurate gain. The calibration of the current sense channel typically takes less than one second.

In the example shown in FIG. 9 a single current sense resistor 920 is provided and the voltage across the current sense resistor 920 is used by both the coulomb counter circuitry 910 and the current sense channel 960. In alternative examples, the coulomb counter circuitry 910 and the current sense channel 960 may each be provided with a dedicated current sense resistor for sensing the current through the load.

In operation of the system 900, the coulomb counter functions essentially as described above with reference to FIG. 1, generating digital accumulator output signal Qout representative of a cumulative amount of charge transferred to the load 120 over a period of time. The output signal Qout may be used, e.g. by downstream processing circuitry (not shown in FIG. 9), to calculate, estimate or otherwise determine a state of charge of a battery which supplies the positive supply rail V+.

The current sense channel 960 is activated periodically (e.g. every N samples, where N is a positive integer, e.g. 10, 50, 100, etc.) to generate a reference output signal Qoutref representative of a cumulative amount of charge transferred to the load 120. Because the current sense channel 960 is a relatively high power channel (e.g., its power consumption is greater than that of the coulomb counter circuitry 910), activating the current sense channel 960 periodically in this way helps to minimise a power consumption of the system 900.

Because the current sense channel 960 is more accurate than the coulomb counter circuitry 910, the reference output signal Qoutref that is generated every N samples can be used to correct the output signal Qout output by the coulomb counter circuitry 910.

The reference output signal Qoutref can be used, in conjunction with the output signal Qout to determine an offset correction to be applied by the correction circuitry 950 to subsequent output signals Qout to correct for offset and/or gain error in the coulomb counter circuitry 910.

For example, if it is assumed that the current through the load 120 changes linearly over time, a rate of change of the reference output signal Qoutref between first and second sample points and a corresponding rate of change of the output signal Qout between the same first and second sample points can be used to determine an initial correction factor to be applied to the output signal Qout by the correction circuitry 950 at future sample points to correct for offset and/or gain error in the coulomb counter circuitry 910. This initial correction factor is applied to the next N samples of the output signal Qout, until the current sense channel is activated again and a new correction factor is calculated and applied to the next N samples of the output signal Qout.

Thus, the correction factor is re-calculated every N samples, such that any changes in offset and/or gain error in the coulomb counter circuitry can be dynamically corrected or compensated for (at least partially) during operation of the coulomb counter circuitry, with a delay of N samples. This dynamic calibration and recalibration can be performed during normal coulomb counting operation of the coulomb counter circuitry 910, and may avoid the need for a time-consuming and costly calibration of the coulomb counter circuitry 910 during manufacture.

As will be appreciated, the value N may be selected according to the application for which the system 900 is used. For example, in applications where a highly accurate indication of a battery SOC is required, N may be smaller (i.e. the current sense channel may be activated more frequently so as to generate a new correction factor more frequently) than in applications where a lower accuracy indication of a battery SOC is acceptable.

As will be apparent to those of ordinary skill in the art, the coulomb counter circuitry and systems of the present disclosure allow a reduction in the time required to calibrate coulomb counter circuitry to correct or compensate (at least partially) for offset and/or gain error. Some examples permit such calibration to be performed during normal coulomb counting operation of the coulomb counter circuitry.

It will be appreciated by those or ordinary skill in the art that although the accompanying Figures depict examples that use single-ended circuitry, the circuitry and systems described above could equally be implemented using differential circuitry.

The circuitry described above with reference to the accompanying drawings may be incorporated in a host device such as a laptop, notebook, netbook or tablet computer, a gaming device such as a games console or a controller for a games console, a virtual reality (VR) or augmented reality (AR) device, a mobile telephone, a portable audio player or some other portable device, or may be incorporated in an accessory device for use with a laptop, notebook, netbook or tablet computer, a gaming device, a VR or AR device, a mobile telephone, a portable audio player or other portable device.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Coulomb counter circuitry operable in a first mode of operation and a second mode of operation, the coulomb counter circuitry comprising:
   first analog to digital converter (ADC) circuitry configured to generate a first ADC output signal indicative of a current through a load coupled to the coulomb counter circuitry;
   second analog to digital converter (ADC) circuitry;
   offset correction circuitry; and
   accumulator circuitry configured to generate a signal indicative of a cumulative amount of charge transferred to the load,
   wherein in the second mode of operation, the coulomb counter circuitry is operable to enable the second ADC circuitry and to generate an offset correction factor based at least in part on a second ADC output signal output by the second ADC circuitry, and
   wherein in subsequent operation of the coulomb counter circuitry in the first mode of operation, the offset correction circuitry applies the offset correction factor to the first ADC output signal.

2. Coulomb counter circuitry according to claim 1, wherein the second ADC circuitry is configured to have a higher resolution than the first ADC circuitry.

3. Coulomb counter circuitry according to claim 1, wherein the first ADC circuitry comprises delta-sigma ADC circuitry.

4. Coulomb counter circuitry according to claim 1, wherein the second ADC circuitry comprises successive approximation register (SAR) ADC circuitry.

5. Coulomb counter circuitry according to claim 1, wherein the coulomb counter circuitry is configured to disable the second ADC circuitry in the first mode of operation.

6. Coulomb counter circuitry according to claim 1, further comprising:
   first sample and hold circuitry configured to sample an output signal of the accumulator circuitry at a first sample time to generate a first sample;
   second sample and hold circuitry configured to sample an output signal of the accumulator circuitry at a second sample time to generate a second sample;
   subtractor circuitry configured to generate a difference signal indicative of a difference between the first sample and the second sample; and
   first multiplier circuitry configured to apply a predetermined first scaling factor to the difference signal to generate the offset correction factor.

7. Coulomb counter circuitry according to claim 2, further comprising:
   second multiplier circuitry configured to apply a predetermined second scaling factor to the second ADC output signal to generate a scaled second ADC output signal of higher resolution than the first ADC output signal; and
   adder circuitry configured to add the scaled second ADC output signal to the first ADC output signal to generate a combined adder output signal of higher resolution than the first ADC output signal,
   wherein the coulomb counter circuitry is configured to supply the combined adder output signal to the accumulator circuitry in the second mode of operation.

8. Coulomb counter circuitry according to claim 7, wherein the predetermined second scaling factor is based at least in part on a gain of the first ADC circuitry and a gain of the second ADC circuitry.

9. Coulomb counter circuitry according to claim 7, wherein the first ADC circuitry comprises delta-sigma ADC circuitry, and wherein the predetermined second scaling factor is based at least in part on a gain of the first ADC circuitry, a gain of the second ADC circuitry and a gain of a feedback DAC circuitry of the delta-sigma ADC circuitry.

10. Coulomb counter circuitry according to claim 7, wherein the first ADC circuitry comprises sigma-delta ADC circuitry, the coulomb counter circuitry further comprising:
   pulse generator circuitry;
   differentiator circuitry; and
   processing circuitry,
   wherein, in the second mode of operation:
      the pulse generator circuitry is operable to supply a single pulse of a predetermined magnitude to an input of feedback DAC circuitry of the sigma-delta ADC;
      the differentiator circuitry is operable to receive a digital output signal generated by the second ADC circuitry based on the single pulse and to output a differentiated output signal to the processing circuitry; and the processing circuitry is operable to generate the predetermined second scaling factor based on the magnitude of the single pulse and the differentiated output signal.

11. Coulomb counter circuitry according to claim 2, further comprising:
second multiplier circuitry configured to apply a predetermined second scaling factor to the second ADC output signal to generate a scaled second ADC output signal of higher resolution than the first ADC output signal,
wherein the coulomb counter circuitry is configured to supply the scaled second ADC output signal to the accumulator circuitry in the second mode of operation.

12. Coulomb counter circuitry according to claim 11, wherein the predetermined second scaling factor is based at least in part on a gain of the first ADC circuitry and a gain of the second ADC circuitry.

13. Coulomb counter circuitry according to claim 11, wherein the first ADC circuitry comprises delta-sigma ADC circuitry, and wherein the predetermined second scaling factor is based at least in part on a gain of the first ADC circuitry, a gain of the second ADC circuitry and a gain of a feedback DAC circuitry of the delta-sigma ADC circuitry.

14. Coulomb counter circuitry according to claim 11, wherein the first ADC circuitry comprises sigma-delta ADC circuitry, the coulomb counter circuitry further comprising:
pulse generator circuitry;
differentiator circuitry; and
processing circuitry,
wherein, in the second mode of operation:
the pulse generator circuitry is operable to supply a single pulse of a predetermined magnitude to an input of feedback DAC circuitry of the sigma-delta ADC;
the differentiator circuitry is operable to receive a digital output signal generated by the second ADC circuitry based on the single pulse and to output a differentiated output signal to the processing circuitry; and
the processing circuitry is operable to generate the predetermined second scaling factor based on the magnitude of the single pulse and the differentiated output signal.

15. Coulomb counter circuitry according to claim 1, wherein the coulomb counter circuitry comprises:
a first processing path comprising the ADC circuitry and the offset correction circuitry; and
a second processing path comprising third ADC circuitry, wherein in the second mode of operation the coulomb counter circuitry is operable to select the second processing path to generate a second signal indicative of a cumulative amount of charge transferred to the load.

16. Coulomb counter circuitry comprising:
analog to digital converter (ADC) circuitry configured to receive an input signal indicative of a current through a load;
accumulator circuitry configured to receive a digital output signal from the ADC circuitry and to generate an accumulator output signal indicative of a cumulative amount of charge transferred to the load; and
correction circuitry configured to apply a correction to the accumulator output signal,
wherein the coulomb counter circuitry is operative to receive, periodically, a reference signal indicative of a cumulative amount of charge transferred to the load, and
wherein the correction signal is based on the received reference signal.

17. Coulomb counter circuitry according to claim 16, wherein the reference signal is received from a current sensing channel of a host device incorporating the coulomb counter circuitry.

18. Coulomb counter circuitry comprising:
delta-sigma analogue to digital converter (ADC) circuitry;
offset correction circuitry;
accumulator circuitry; and
second ADC circuitry of higher resolution than the delta sigma ADC circuitry,
wherein, in a calibration mode of operation, the coulomb counter circuitry is operative to generate an offset correction to be applied by the offset correction circuitry during subsequent operation in a coulomb counting mode of operation,
wherein the offset correction is based at least in part on a signal output by the second ADC circuitry.

19. An integrated circuit comprising coulomb counter circuitry according to claim 1.

20. A host device comprising coulomb counter circuitry according to claim 1.

21. A host device according to claim 20, wherein the host device comprises a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console, a VR or AR device, a mobile telephone, a portable audio player or other portable device.

* * * * *